(12) United States Patent
Nakayama et al.

(10) Patent No.: US 9,995,977 B2
(45) Date of Patent: Jun. 12, 2018

(54) CIRCUIT BOARD, DISPLAY PANEL, AND DISPLAY DEVICE

(71) Applicant: SHARP KABUSHIKI KAISHA, Sakai (JP)

(72) Inventors: Masaki Nakayama, Sakai (JP); Motoji Shiota, Sakai (JP); Takashi Matsui, Sakai (JP); Yasuhiko Tanaka, Sakai (JP); Hiroki Miyazaki, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 62 days.

(21) Appl. No.: 15/318,532

(22) PCT Filed: Jun. 19, 2015

(86) PCT No.: PCT/JP2015/067704
§ 371 (c)(1),
(2) Date: Dec. 13, 2016

(87) PCT Pub. No.: WO2015/198982
PCT Pub. Date: Dec. 30, 2015

(65) Prior Publication Data
US 2017/0131586 A1    May 11, 2017

(30) Foreign Application Priority Data

Jun. 26, 2014    (JP) .................. 2014-131274

(51) Int. Cl.
*G02F 1/1345*  (2006.01)
*H05K 1/18*  (2006.01)
*H05K 1/02*  (2006.01)
*H01L 23/498*  (2006.01)
*H01L 23/31*  (2006.01)

(52) U.S. Cl.
CPC ...... *G02F 1/13452* (2013.01); *H01L 23/3142* (2013.01); *H01L 23/49811* (2013.01); *H05K 1/028* (2013.01); *H05K 1/181* (2013.01); *H05K 2201/10136* (2013.01); *H05K 2201/10204* (2013.01); *H05K 2201/10734* (2013.01); *H05K 2201/10977* (2013.01)

(58) Field of Classification Search
None
See application file for complete search history.

(56) References Cited

FOREIGN PATENT DOCUMENTS

JP    2009-192796    8/2009

*Primary Examiner* — Britt D Hanley
(74) *Attorney, Agent, or Firm* — ScienBiziP, P.C.

(57) ABSTRACT

An array circuit board 11B includes a glass substrate, an IC chip 20, two ACFs 30, and a resin film 32. The IC chip 20 is disposed on the glass substrate. The ACFs 30 are disposed between the glass substrate and the IC chip 20 for electrically connecting the glass substrate and the IC chip 20 together. The ACFs 30 are separated from each other. The resin film 32 is made of resin material having cure shrinkage smaller than the ACFs 30 and disposed to fill a gap between the ACFs 30 adjacent to each other between the glass substrate and the IC chip 20.

9 Claims, 16 Drawing Sheets

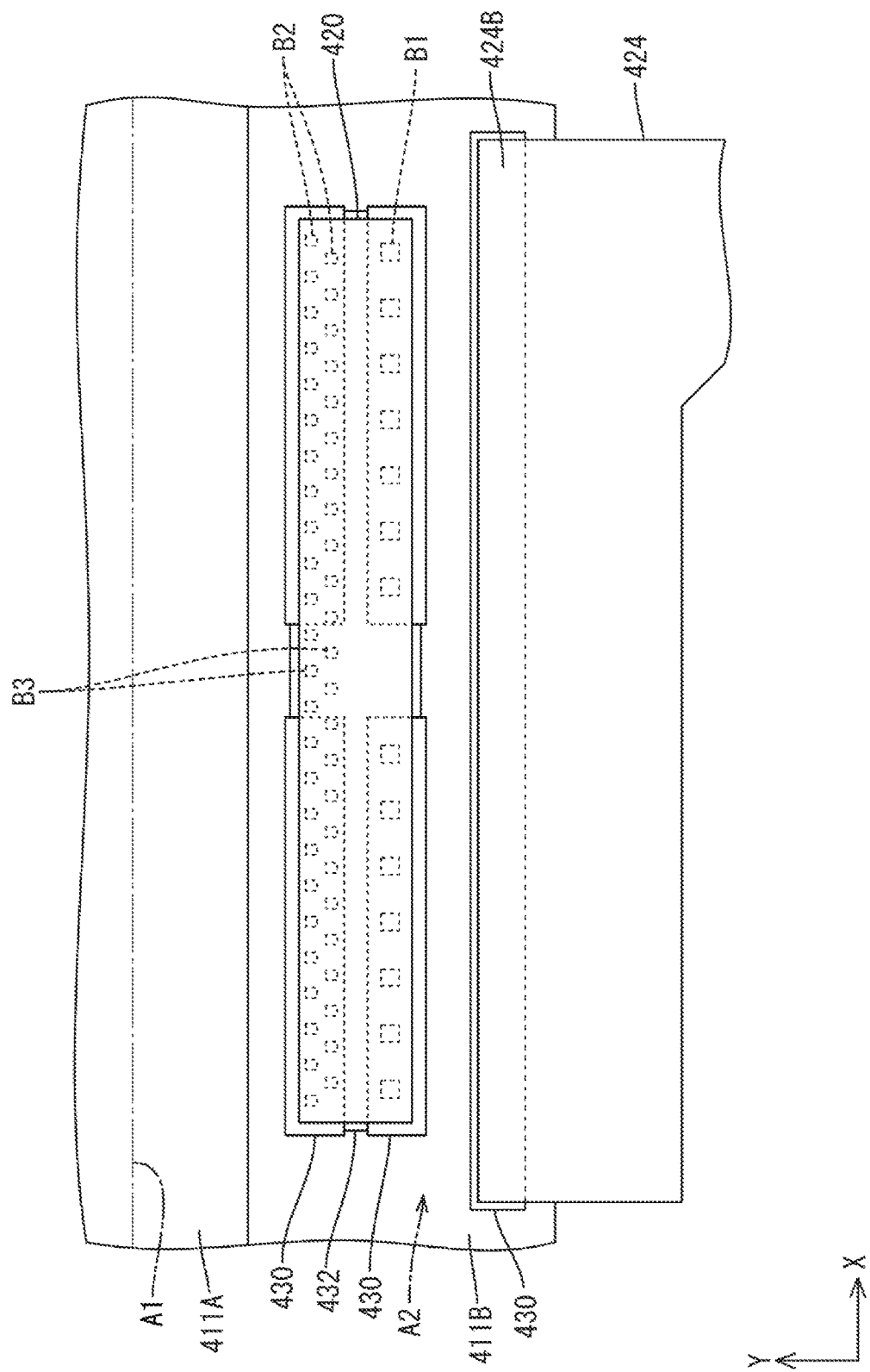

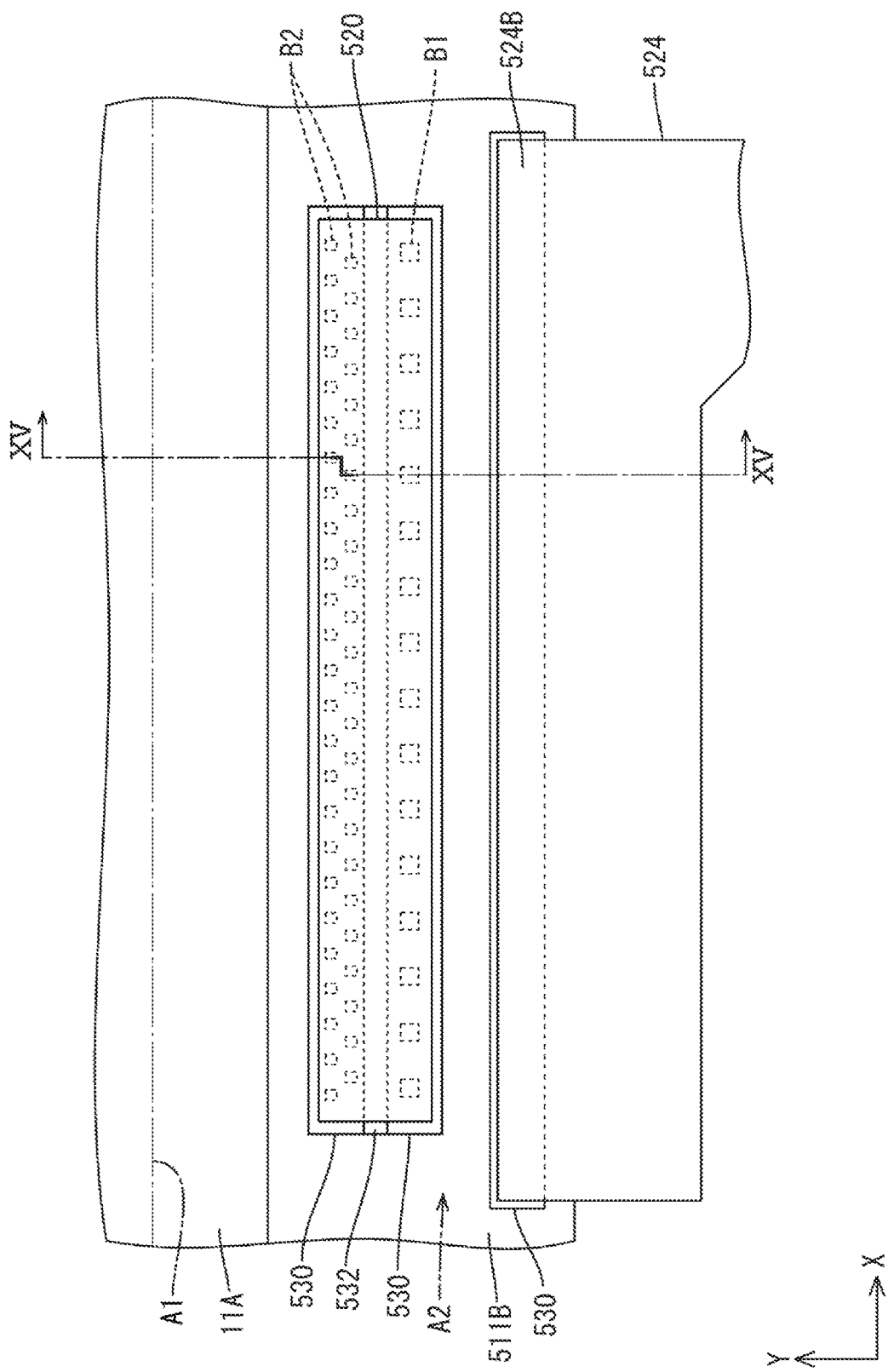

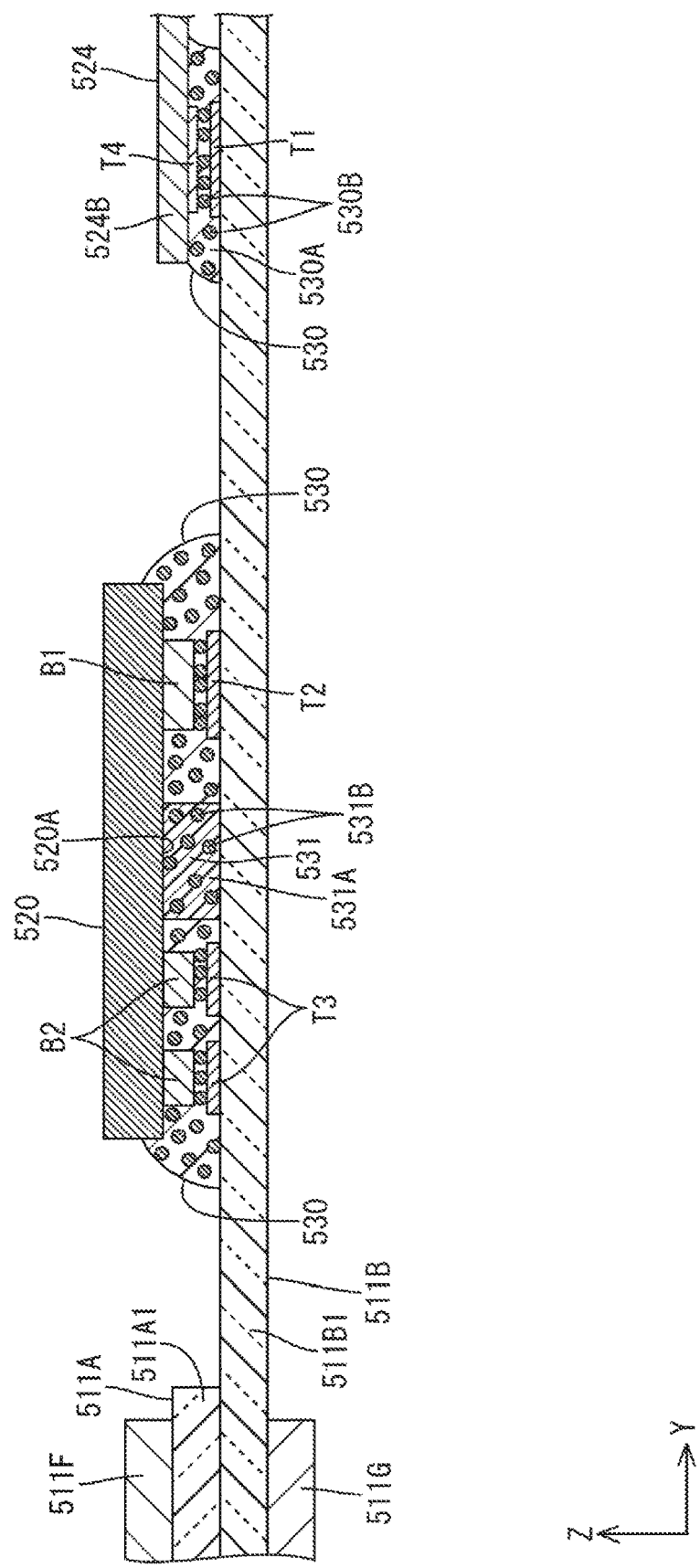

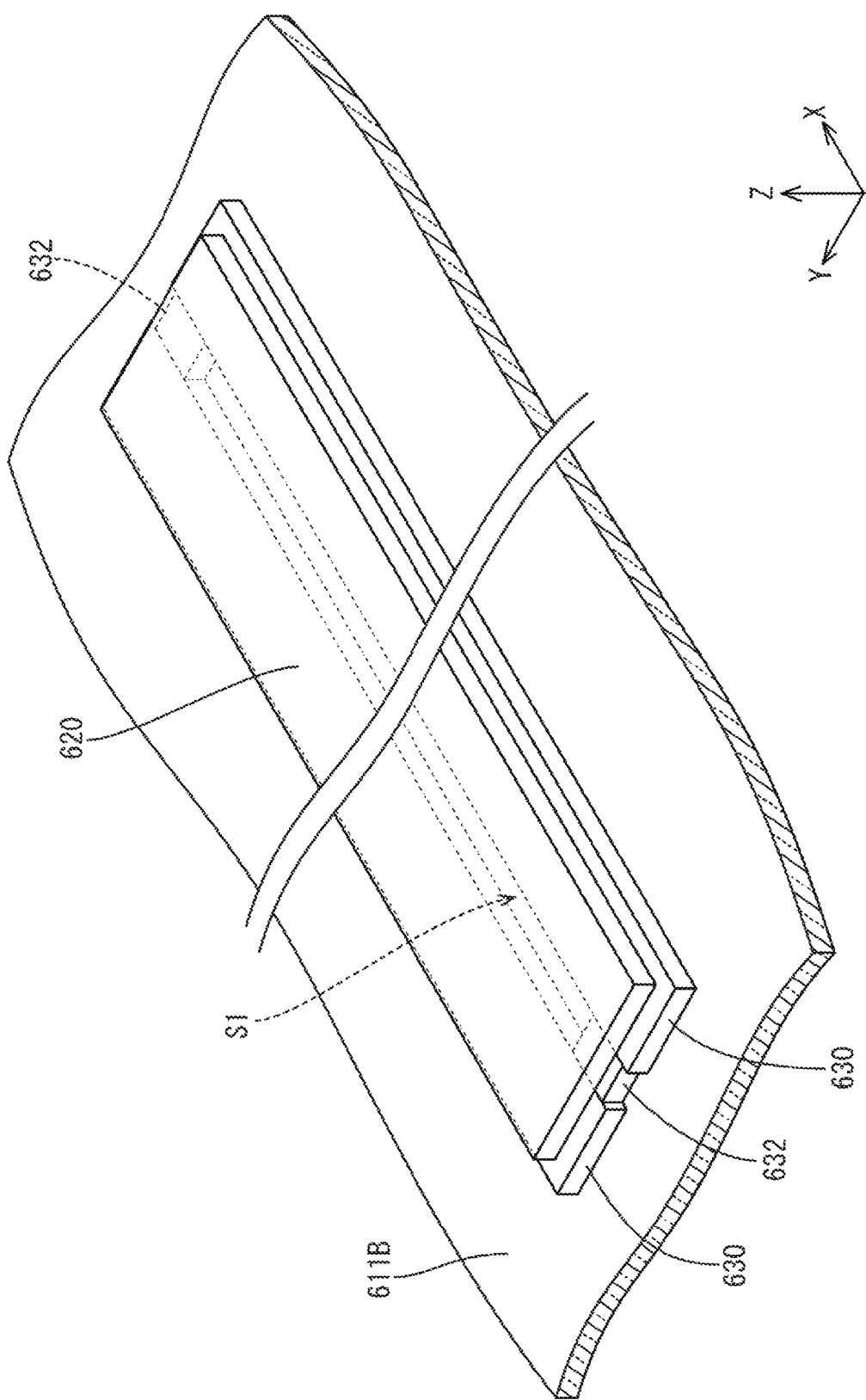

CIRCUIT BOARD, DISPLAY PANEL, AND DISPLAY DEVICE

CROSS-REFERENCE TO RELATED APPLICATIONS

This application is a U.S. National Phase patent application of International Patent Application No. PCT/JP2015/067704, filed on Jun. 19, 2015, which claims priority to Japanese Application No. 2014-131274, filed on Jun. 26, 2014, each of which is hereby incorporated by reference in the present disclosure in its entirety.

FIELD OF THE INVENTION

The present invention relates to a circuit board, a display panel, and a display device.

BACKGROUND OF THE INVENTION

A circuit board including electronic components such as integrated circuit (IC) chips mounted on a substrate via an anisotropic conductive film (ACF) containing conductive particles has been known. A chip on glass (COG) mounting technology is an example of directly mounting an IC chip for driving a display panel on a substrate of the display panel in an area other than a display area of the display panel via the anisotropic conductive film.

Through the COG mounting technology, in general, a single anisotropic conductive film is disposed between the glass substrate and the IC chip and the IC chip is press-bonded to the glass substrate via the anisotropic conductive film. The anisotropic conductive film includes a thermoset resin as an adhesive. When the anisotropic conductive film shrinks during curing, the IC chip may be pulled toward the glass substrate and warped. A technology for reducing such a warp of the IC chip when the anisotropic conductive film shrinks during curing is disclosed in Patent Document 1.

CITATION LIST

Patent Document 1: Japanese Unexamined Patent Application Publication No. 2009-192796

SUMMARY OF THE INVENTION

The circuit board described above includes connecting terminals in an area of the substrate in which the electronic component is disposed and on a surface of the electronic component opposed to the substrate. Connecting portions between the substrate and the electronic component need to be protected from water and dust. In the circuit board, warps of the electronic components on the substrate need to be reduced. Furthermore, the connecting portions between the substrate and the electronic component need to be protected from dust, moisture, and water.

The technologies disclosed in this description were made in view of the above circumstances. An object is to protect connecting portions between a substrate and an electronic component from dust, moisture, and water while reducing a warp of the electronic component electrically connected to the substrate via an anisotropic conductive film.

A technology disclosed in this specification relates to a circuit board. The circuit board includes a substrate, an electronic component, anisotropic conductive films, and an inter-film member. The electronic component is disposed on the substrate. The anisotropic conductive films are disposed between the substrate and the electronic component for electrically connecting the electronic component to the substrate. The anisotropic conductive films are separated from each other. The inter-film member includes at least one resin film and a low shrinkage portion. The resin film is disposed in at least a portion of a gap between the anisotropic conductive films adjacent to each other between the substrate and the electronic component to fill the portion of the gap facing an outside. The low shrinkage portion has cure shrinkage smaller than cure shrinkage of the anisotropic conductive films.

The circuit board includes the electronic component connected to the substrate via the anisotropic conductive films that are separated from each other and the inter-film member disposed in the gap between the anisotropic conductive films. The inter-film member includes the low shrinkage portion having the cure shrinkage smaller than the cure shrinkage of the anisotropic conductive films. According to the configuration, forces of the anisotropic conductive films pulling the electronic component toward the substrate produced when the anisotropic conductive films shrink during curing are reduced in a portion configured as the low shrinkage portion. In comparison to a known configuration in which an electronic component is electrically connected to a substrate via a single anisotropic conductive film (without a separate film) in an area in which the anisotropic conductive film needs to be disposed between the substrate and the electronic component, a warp of the electronic component can be reduced.

Furthermore, the inter-film member includes the resin film that fills at least the portion of the gap between the anisotropic conductive films facing the outside. Namely, the portion is closed with the resin film. According to the configuration, the anisotropic conductive films or the resin film is disposed in portions of space between the substrate and the electronic component facing the outside. Therefore, water or dust is restricted from entering or less likely to enter connecting portions between the substrate and the electronic component. In the circuit board, the connecting portions between the substrate and the electronic component are protected from duct, moisture, and water while a warp of the electronic component electrically connected to the substrate via the anisotropic conductive films is reduced.

The resin film and the low shrinkage portion may be made of same material.

According to the configuration, forces of the anisotropic conductive films pulling the electronic component toward the substrate produced when the anisotropic conductive films shrink during curing are reduced not only in the low shrinkage portion but also in the resin film. Therefore, the warp of the electronic component is further reduced.

The electronic component may have a rectangular shape in a plan view. The anisotropic conductive films may be separated from each other in a direction along one of edges of the electronic component having the rectangular shape in the plan view.

The electronic component having the rectangular shape in the plan view tends to warp in the direction along one of the edges when the anisotropic conductive films disposed between the substrate and the electronic component shrink during curing. According to the configuration described above, the forces of the anisotropic conductive films pulling the electronic component toward the substrate produced when the anisotropic conductive films shrink during curing are reduced in the area in which the resin film is disposed. Therefore, the warp of the electronic device is effectively reduced.

The low shrinkage portion may be arranged between a center of the electronic device in the plan view and the substrate.

The center of the electronic component in the plan view having the rectangular shape in the plan view is located the farthest from corners of the electronic components. If the center of the electronic component is connected to the substrate via the anisotropic conductive film, the electronic component tends to significantly warp when the anisotropic conductive film shrinks during curing. In the configuration, the low shrinkage portion is provided between the center portion and the substrate. In comparison to a configuration in which the center is connected to a substrate via an anisotropic conductive film, the warp of the electronic component is effectively reduced.

The electronic component may include a bump protruding toward the substrate and electrically connected to the electronic component and a dummy bump protruding toward the substrate and not electrically connected to the electronic component. The anisotropic conductive films may be disposed at least in an area in which the bumps are disposed.

According to the configuration, the warp of the electronic component can be reduced while electrical connection is established between the substrate and the electronic component in the area in which the bump is disposed and the dummy bump performs functions to improve heat dissipation of the electronic component and to adjust a position of the electronic component in the area in which the dummy bump is disposed.

The electronic component may be covered with a sealing member.

According to the configuration, the electronic component is further protected from dust, moisture, and water with the sealing member.

Another technology described in this specification relates to a display device including the circuit board described above. The substrate includes a display area in which an image is displayed and a non-display area in which an image is not displayed. The electronic component is disposed in the non-display area of the substrate.

The display panel may include a flexible circuit board connected to the non-display area of the substrate. One of the anisotropic conductive films may extend from the substrate to the flexible circuit board to electrically connect the flexible circuit board to the substrate.

According to the configuration, another anisotropic conductive film for electrically connecting the flexible circuit board to the substrate is not required. Therefore, the production process of the display panel can be simplified.

Another technology described in this specification relates to a display device including a lighting device and the display device for displaying an image using light from the lighting device. The electronic component is an IC chip for driving the display panel.

According to the technologies described in this specification, the connecting portions between the substrate and the electronic component are protected from dust, moisture, and water while the warp of the electronic component electrically connected to the substrate via the anisotropic conductive films is reduced.

BRIEF DESCRIPTION OF THE DRAWINGS

FIG. 13 is a magnified plan view of a non-display area of a liquid crystal panel according to a fourth embodiment.

FIG. 14 is a magnified plan view of a non-display area of a liquid crystal panel according to a fifth embodiment.

FIG. 15 is a magnified cross-sectional view of the non-display area of the liquid crystal panel illustrating a cross-sectional configuration on a XV-XV plane in FIG. 14.

FIG. 16 is a perspective view of an IC chip mounting area and therearound in a sixth embodiment.

DETAILED DESCRIPTION OF THE INVENTION

Figure 1:
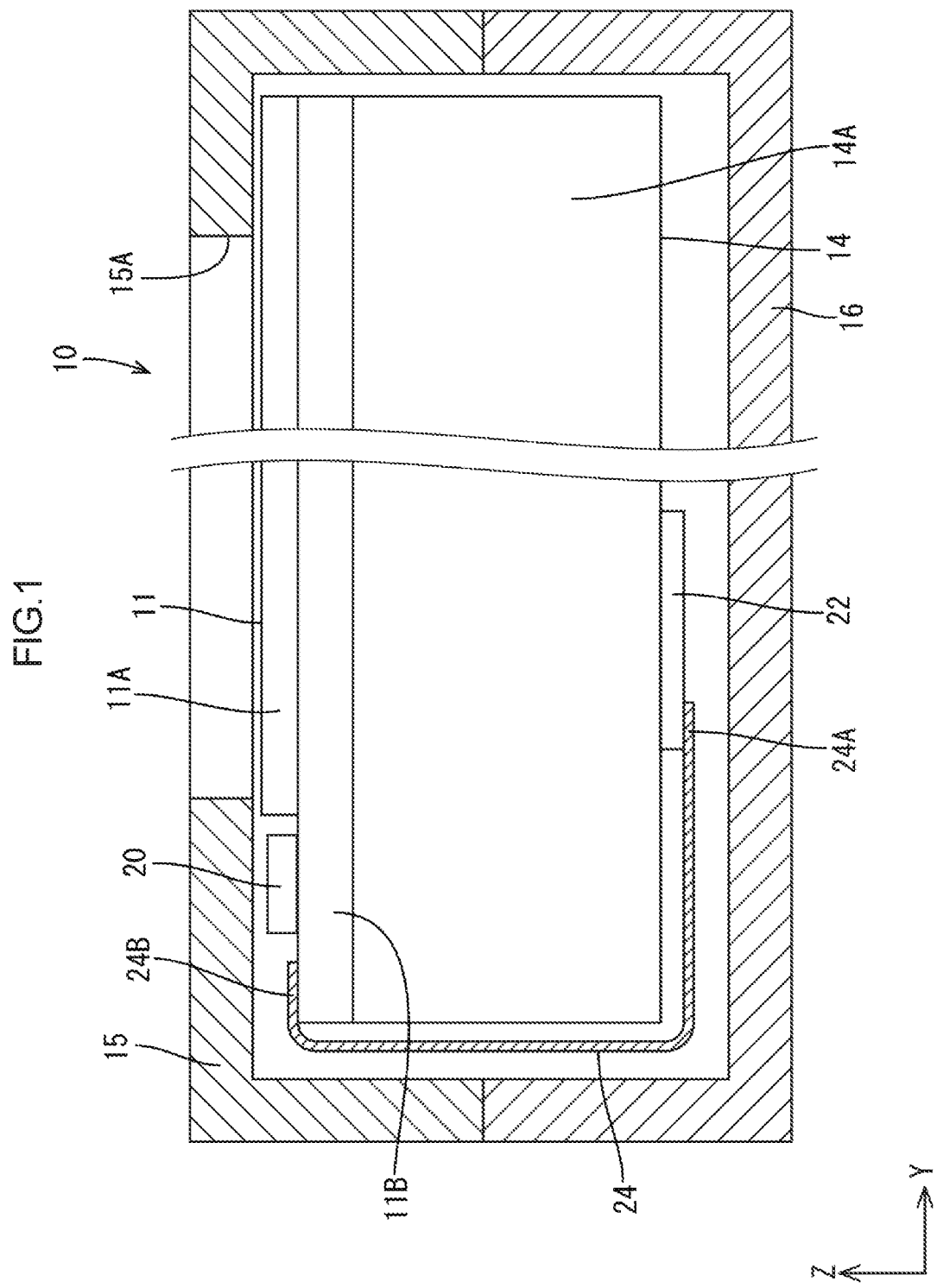
FIG. 1 is a schematic cross-sectional view of a liquid crystal display device according to a first embodiment along a long-side direction.

A first embodiment will be described with reference to the drawings. A liquid crystal display device 10 (an example of a display device) including a liquid crystal panel 11 (an example of a display panel) will be described as an example. X-axes, Y-axes, and Z-axes may be present in the drawings. The axes in each drawing correspond to the respective axes in other drawings. The vertical direction is defined based on FIG. 1. An upper side in FIG. 1 corresponds to a front side of the liquid crystal display device 10. A lower side in FIG. 1 corresponds to a rear side of the liquid crystal display device 10.

Figure 2:
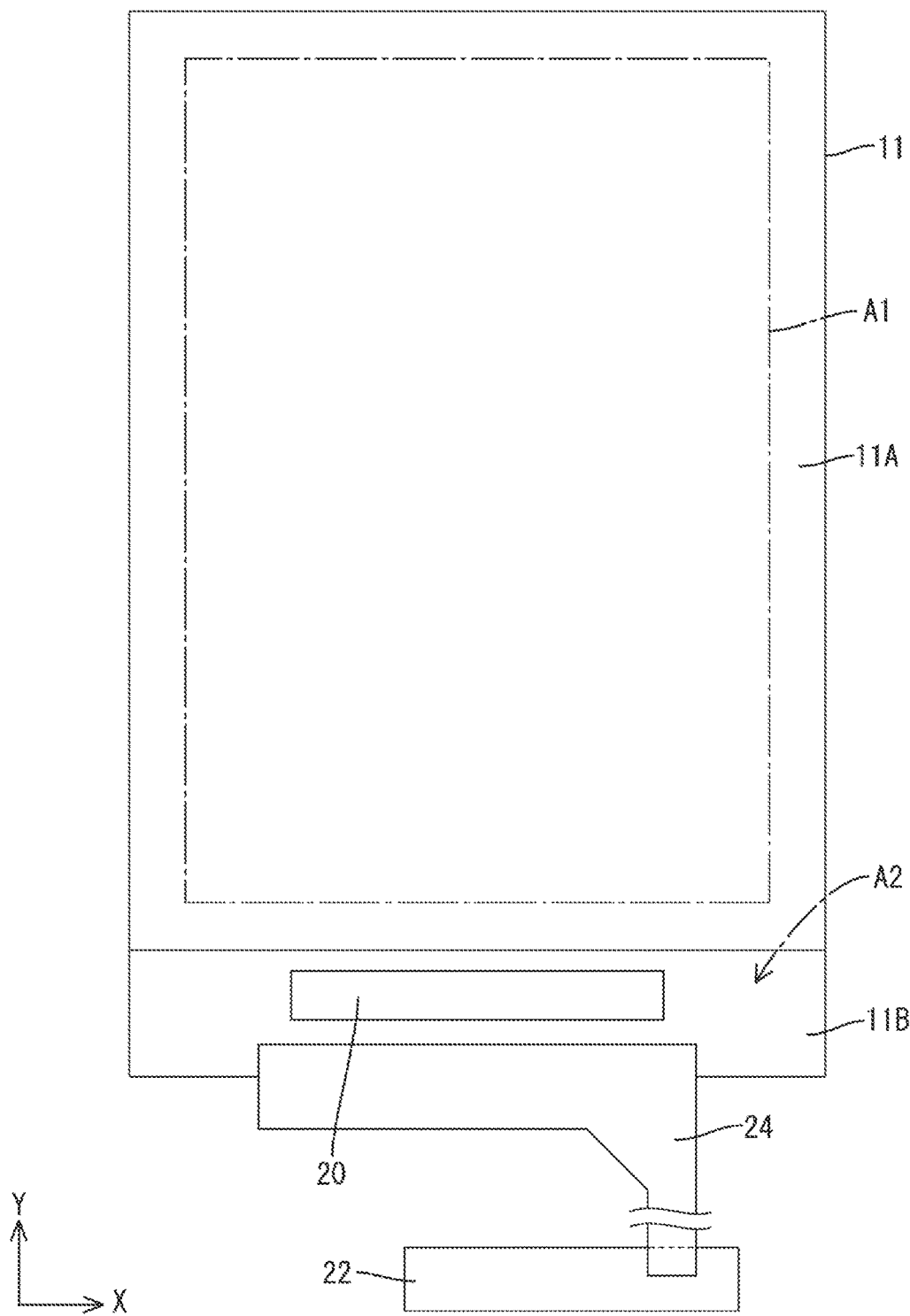
FIG. 2 is a schematic plan view of the liquid crystal panel.

As illustrated in FIGS. 1 and 2, the liquid crystal display device 10 includes the liquid crystal panel 11, an IC chip 20, a control circuit board 22, a flexible circuit board 24, and a backlight unit 14 (an example of a lighting device). The IC chip 20 is an electronic component mounted on the liquid crystal panel 11 for driving the liquid crystal panel 11. The control circuit board 22 is for supplying various kinds of input signals from an outside to the IC chip 20. The flexible circuit board 24 electrically connects the liquid crystal panel 11 to the control circuit board 22 that is an external component. The backlight unit 14 is an external light source for supplying light to the liquid crystal panel 11. The liquid crystal panel 11 and the backlight unit 14 are attached to each other. The liquid crystal display device 10 further includes outer members 15 and 16 on a front side and a rear side and coupled together for holding the liquid crystal panel 11 and the backlight unit 14 therein. The outer member 15 on the front side includes an opening 15A through which images displayed on the liquid crystal panel 11 can be viewed from the outside.

The backlight unit 14 will be briefly described. As illustrated in FIG. 1, the backlight unit 14 includes a chassis 14A, a light source (such as a cold cathode tube, an LED, and an organic EL) disposed inside the chassis 14A, and an optical member disposed to cover the opening of the chassis 14A. The light source and the optical member are not illustrated. Planar light formed through the optical member enters the liquid crystal panel 11. The planar light is used for displaying images on the liquid crystal panel 11.

The liquid crystal panel 11 will be described. As illustrated in FIG. 2, the liquid crystal panel 11 has a vertically long rectangular overall shape. A long-side direction and a short-side direction of the liquid crystal panel 11 correspond with the Y-axis direction and the X-axis direction in each drawing, respectively. A large portion of the liquid crystal panel 11 includes a display area A1 in which images can be displayed. A portion of the liquid crystal panel 11 closer to one of ends of a long dimension (on a lower side in FIG. 2) includes a non-display area A2 in which images are not displayed. The IC chip 20 and the flexible circuit board 24 are mounted to portions of the non-display area A2 through pressure bonding via anisotropic conductive films (hereinafter referred to as ACFs) 30 (see FIG. 4). In FIG. 1, a chain line forming a frame shape slightly smaller than a color filter circuit board 11A, which will be described later, indicates an outline of the display area A1 and an area outside the chain line is the non-display area A2.

Figure 3:
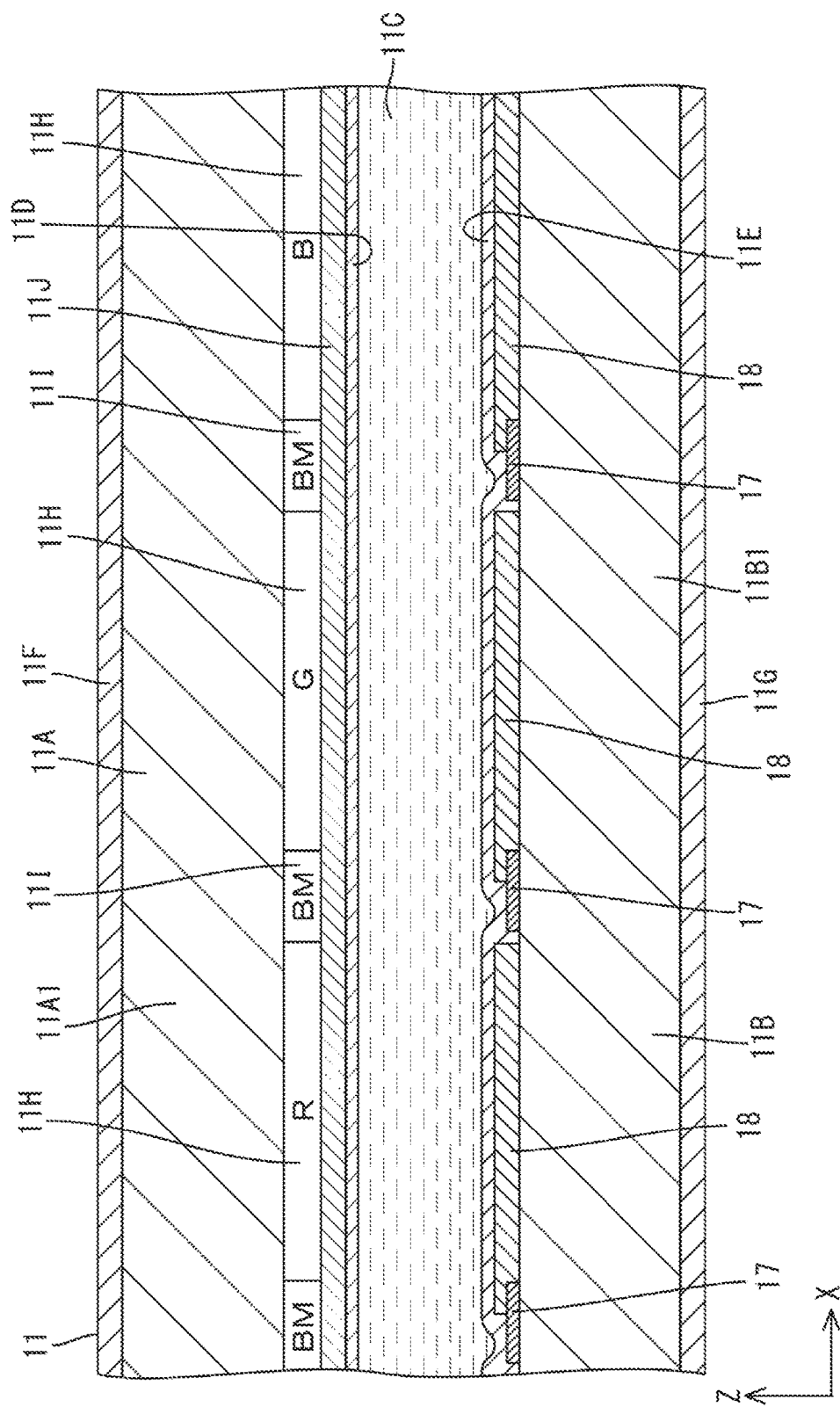
FIG. 3 is a schematic cross-sectional view illustrating a cross-sectional configuration of the liquid crystal panel.

As illustrated in FIG. 3, the liquid crystal panel 11 includes a pair of glass circuit boards 11A and 11B having high light transmissivity and a liquid crystal layer 11C including liquid crystal molecules having optical characteristics that vary according to application of electric field. The circuit boards 11A and 11B included in the liquid crystal panel 11 are bonded together with a sealing member, which is not illustrated, with a gap corresponding to a thickness of the liquid crystal layer 11C therebetween. The circuit board 11A on the front side is the color filter circuit board 11A. The circuit board 11B on the rear side (the back side) is an array circuit board 11B (an example of a circuit board). Alignment films 11D and 11E are formed on inner surfaces of the circuit boards 11A and 11B, respectively. The alignment films 11D and 11E are for aligning the liquid crystal molecules included in the liquid crystal layer 11C. Polarizing plates 11F and 11G are bonded to outer surfaces of glass substrates 11A1 and 11B1 included in the substrates 11A and 11B, respectively.

As illustrated in FIG. 2, the color filter circuit board 11A has a short dimension about equal to that of the array circuit board 11B and a long dimension smaller than that of the array circuit board 11B. The color filter circuit board 11A is bonded to the array circuit board 11B with a first end of the long dimension (on an upper side in FIG. 2) aligned with a corresponding end of the array circuit board 11B. Front and rear plate surfaces of the array circuit board 11B at a second end of long dimension (on a lower side in FIG. 2) are exposed. The color filter circuit board 11A does not overlap a predefined area of the array circuit board 11B and this area is configured as a mounting area in which the IC chip 20 and the flexible circuit board 24 are mounted. The glass substrate 11B1 of the array circuit board 11B includes a main portion to which the color filter circuit board 11A and the polarizing plate 11G are bonded. The color filter circuit board 11A and the polarizing plate 11G do not overlap the mounting area in which the IC chip 20 and the flexible circuit board 24 are mounted.

Configurations of the array circuit board 11B and the color filter circuit board 11A inside the display area A1 will be described. As illustrated in FIG. 3, TFTs 17 and pixel electrodes 18 are arranged in a matrix on an inner surface of the glass substrate 11B1 (an example of a substrate) of the array circuit board 11B (on the liquid crystal layer 11C side). The TFTs 17 are switching components. Gate lines and source lines are routed in a grid to surround the respective TFTs 17 and the respective pixel electrodes 18. Namely, the TFTs 17 and the pixel electrodes 18 arranged in a matrix are disposed at intersections of the gate lines and the source lines routed in a grid, respectively. The gate lines and the source lines are not illustrated. The gate lines are connected to gate electrodes of the TFTs 17 and the source lines are connected to source electrodes of the TFTs 17. The pixel electrodes are connected to drain electrodes of the TFTs 17. Each of the pixel electrodes 18 has a vertically long rectangular shape in a plan view. The pixel electrodes 18 are made of transparent electrode material such as indium tin oxide (ITO) and zinc oxide (ZnO). Capacitance lines (not illustrated) may be formed on the array electrode 11B parallel to the gate lines to cross the pixel electrodes 18.

As illustrated in FIG. 3, color filters 11H are formed on an inner surface of the glass substrate 11A1 of the color filter circuit board 11A (on the liquid crystal layer 11C side). The color filters 11H include red (R), green (G), and blue (B) color portions arranged in a matrix to overlap the pixel electrodes 18 on the array circuit board 11B side in the plan view. A light blocking layer (a black matrix) 11I is formed in a grid pattern between the color portions of the color filters 11H for reducing color mixture. The light blocking layer 11I overlaps the gate lines and the source lines in the plan view. A counter electrode 11J is formed in a solid pattern on the color filters 11H and the light blocking layer 11I opposite the pixel electrodes 18. Each of display pixels in the liquid crystal panel 11, which is a unit of display, includes three color portions of red (R), green (G), and blue (B) and three pixel electrodes 18 opposed to the color portions. The display pixel includes a red pixel including the R color portion, a green pixel including the G color portion, and a blue pixel including the B color portion. The color pixels are repeatedly arranged on the plate surface of the liquid crystal panel 11 along a row direction (the X-axis direction) to form lines of pixels. The lines of pixels are arranged along a column direction (the Y-axis direction).

The components connected to the liquid crystal panel 11 will be described. As illustrated in FIGS. 1 and 2, the control circuit board 22 is attached to the back surface of the chassis 14A of the backlight unit 14 (an outer surface on a side opposite from the liquid crystal panel 11 side) with a screw or other fixing member. The control circuit board 22 includes a substrate made of paper phenol or glass epoxy resin and electronic components mounted on the substrate for supplying various kinds of input signals to the IC chip 20. The control circuit board 22 further includes predetermined traces (conductive lines), which are not illustrated, routed on the substrate. One of ends (a first end) of the flexible circuit board 24 is electrically and mechanically connected to the control circuit board 22 via the ACF 30.

As illustrated in FIG. 1, the flexible circuit board 24 includes a base member made of synthetic resin (e.g., polyimide resin) having an insulating property and flexibility and traces (not illustrated) on the base member. As described earlier, a first end 24A, which is one of ends of the flexible circuit board 24 with respect to the length direction thereof, is connected to the control circuit board 22 on the back surface of the chassis 14A. The other end (a second end) 24B of the flexible circuit board 24 is connected to the second end of the array circuit board 11B of the liquid crystal panel 11 with respect to the long-side direction. Namely, the flexible circuit board 24 is folded such that a shape in a cross-sectional view is a U-like shape. The ends 24A and 24B of the flexible circuit board 24 with respect to the length direction include exposed portions of traces which form terminals (not illustrated). The terminals are electrically connected to the control circuit board 22 and the liquid crystal panel 11. According to the configuration, the input signals supplied by the control circuit board 22 are transmitted to the liquid crystal panel 11.

The IC chip 20 includes a driver circuit. The IC chip 20 includes traces and components formed on a silicon wafer that contains silicon with high purity. The IC chip 20 generates output signals based on the signals supplied by the control circuit board 22, which is a signal source, and feeds the signals to the display area A1 of the liquid crystal panel 11. As illustrated in FIG. 2, the IC chip 20 has a horizontally long rectangular shape in the plan view. The IC chip 20 is orientated such that a long-side direction thereof is along the short-side direction of the liquid crystal panel 11 and a short-side direction thereof is along the long-side direction of the liquid crystal panel 11. The IC chip 20 is directly mounted in the non-display area A2 of the liquid crystal panel 11 with the COG mounting technology.

Figure 4:
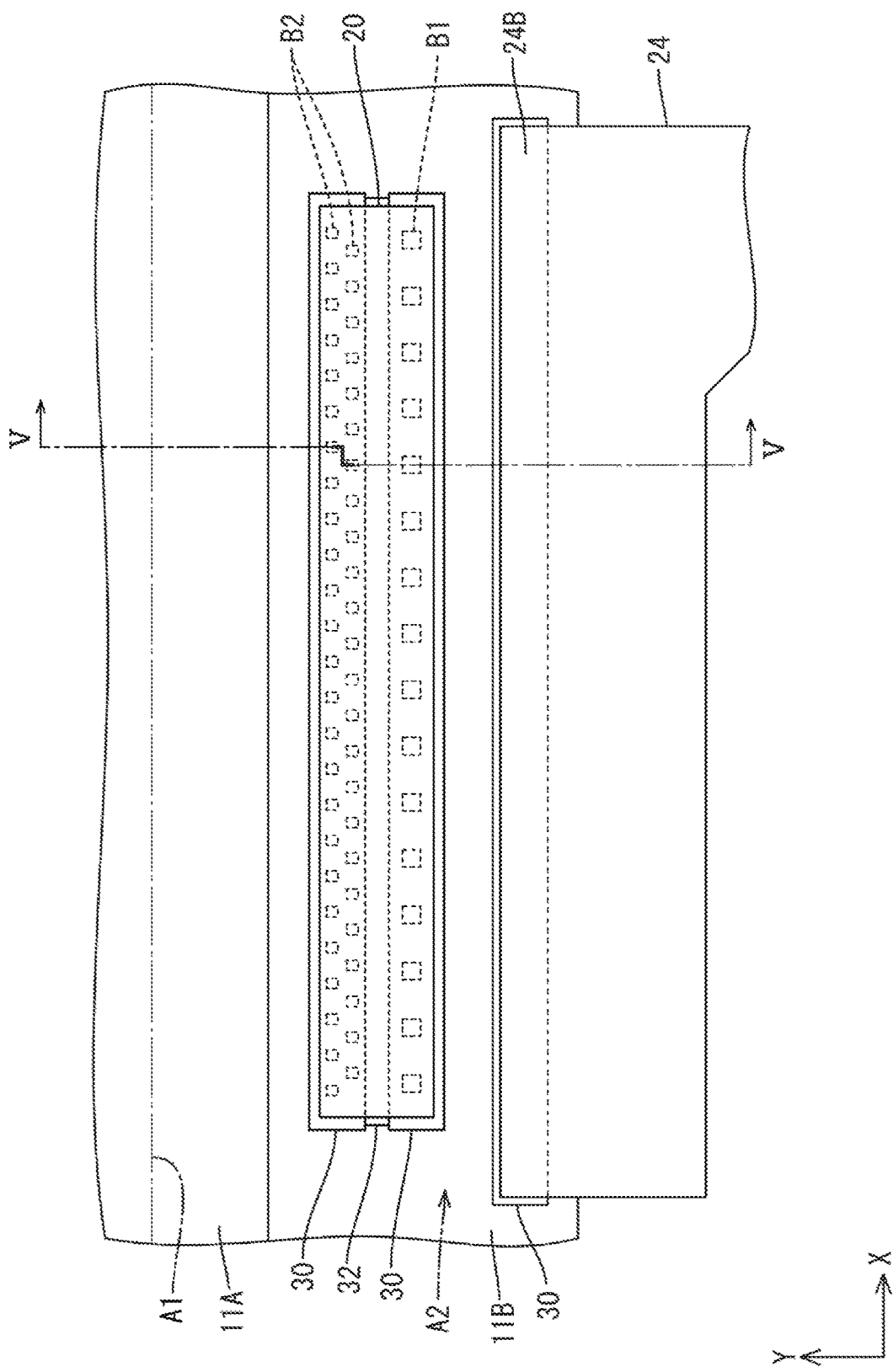
FIG. 4 is a magnified plane view of a non-display area of the liquid crystal panel.

Connecting configurations of the flexible circuit board 24 and the IC chip 20 with the array circuit board 11B in the non-display area A2 will be described in detail. The flexible circuit board 24 is held with the length direction thereof along the long-side direction of the array circuit board 11B (the Y-axis direction) and the second end 24B of the flexible circuit board 24 is connected to a middle portion of the second end of the array circuit board 11B. The second end of the array circuit board 11B is one of the ends of the array circuit board 11B with respect to the long-side direction thereof. As illustrated in FIG. 4, the second end 24B of the flexible circuit board 24 connected to the array circuit board 11B extends along the short-side direction of the array circuit board 11B (the X-axis direction). The IC chip 20 is positioned closer to the display area A1 in comparison to the flexible circuit board 24 in a portion of the array circuit board 11B which does not overlap the color filter circuit board 11A in the non-display area A2. Namely, the IC chip 20 is positioned between the display area A1 and the flexible circuit board 24 on the array circuit board 11B in the non-display area A2.

Figure 5:
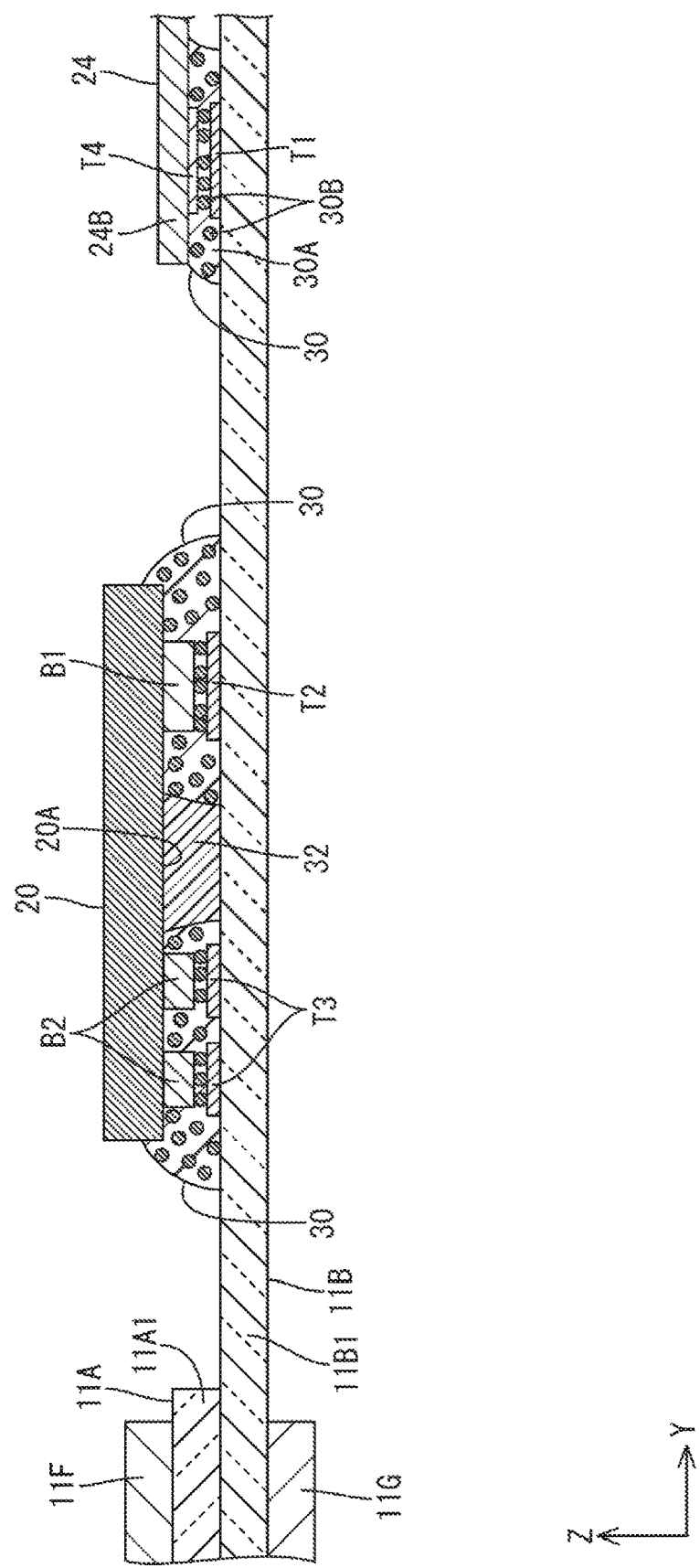
FIG. 5 is a magnified cross-sectional view of the non-display area of the liquid crystal panel illustrating a cross-sectional configuration along line V-V in FIG. 4.

As illustrated in FIG. 5, external connection terminals T1 for receiving the input signals from the flexible circuit board 24 are disposed in the mounting area of the array circuit board 11B in which the flexible circuit board 24 is mounted. Panel-side input terminals T2 for inputting signals to the IC chip 20 and panel-side output terminals T3 for receiving the signals output from the IC chip 20 are disposed in the mounting area of the array circuit board 11B in which the IC chip 20 is mounted. The external connection terminals T1 and the panel-side input terminals T2 are electrically connected to relay lines (not illustrated) routed across a portion of the array circuit board 11B between the mounting area in which the flexible circuit board 24 is mounted and the mounting area in which the IC chip 20 is mounted in the non-display area A2. Thin films of the panel-side input terminals T2 and the panel-side output terminals T3 made of the same metal material as the gate lines and the source lines are covered with a transparent electrode material made of ITO or ZnO, which is also the material of the pixel electrodes 18.

As illustrated in FIG. 5, board-side terminals T4 are disposed on one of the plate surface of the second end 24B of the flexible circuit board 24 facing the array circuit board 11B. The board-side terminals 14 are electrically connected to the external connection terminals T1 via the ACF 30 on the external connection terminals T1 on the array circuit board 11B. Each ACF 30 includes a thermoset resin 30A and a large number of conductive particles 30B. The thermoset resin 30A is an adhesive having an insulating property. The conductive particles 30B are dispersed in the thermoset resin 30A. The thermoset resin 30A of each ACF 30 may be a phenoxy resin or an epoxy resin with a setting agent added thereto. In this embodiment, the second end 24B of the flexible circuit board 24 is connected to the external connection terminals T1 on the array circuit board 11B via the ACF 30 through pressure bonding. The conductive particles 30B are pressed between the external connection terminals T1 and the board-side terminals T4. According to the configuration, electrical connection is established between the external connection terminals T1 and the board-side terminals T4.

As illustrated in FIGS. 4 and 5, input-side bumps B1 and output-side bumps B2 are formed on one of the surfaces of the IC chip 20 facing the array circuit board 11B (hereinafter referred to as a mounting surface) at ends of the IC chip 20 with respect to the short-side direction. The input-side bumps B1 and the output-side bumps B2 protrude toward the array circuit board 11B to form block shapes with rectangular shapes in the plan view. The input-side bumps B1 and the output-side bumps B2 are electrically connected to the IC chip 20. The input-side bumps B1 are arranged at predetermined intervals along the long-side direction of the IC chip 20 and opposed to the panel-side input terminals T2 on the array circuit board 11B. The output-side bumps B2 are smaller than the input-side bumps B1 in the plan view. The output-side bumps B2 are arranged at predetermined intervals in a zigzag manner and two lines. The output-side bumps B2 are opposed to the panel-side output terminals T3.

The input-side bumps B1 on the IC chip 20 are electrically connected to the panel-side input terminals T2 via the ACF 30 on the panel-side input terminals T2 on the array circuit board 11B. This ACF 30 is disposed between the array circuit board 11B and the IC chip 20 to cover exposed surfaces of the panel-side input terminals T2 and exposed surfaces of the input-side bumps B1 without any gaps. The output-side bumps B2 on the IC chip 20 are electrically connected to the panel-side output terminals T3 via the ACF 30 on the panel-side output terminals T3 on the array circuit board 11B. This ACF 30 is disposed between the array circuit board 11B and the IC chip 20 to cover exposed surfaces of the panel-side output terminals T3 and the output-side bumps B2 without any gaps. In this embodiment, the ACFs 30 are arranged separately from each other and along a long-side direction of a mounting surface 20A of the IC chip 20. Namely, the ACFs 30 are separated from each other (see FIGS. 4 to 6) in a direction along a short edge of the mounting surface 20A of the IC chip 20 (the Y-axis direction). The ACFs 30 are disposed on the array circuit board 11B in the same step of a production process of the liquid crystal panel 11.

The ACFs 30 described above and the ACF 30 that electrically connects the external connection terminals T1 to the board-side terminals T4 are the same kind. Therefore, kinds and contents of the thermoset resins 30A and the conductive particles 30B included in the ACFs 30 are the same. A configuration of electrical connection between the panel-side input terminals T2 and the input-side bumps B1 and a configuration of electrical connection between the panel-side output terminals T3 and the output-side bumps B2 are the same as a configuration of electrical connection between the external connection terminals T1 and the board-side terminals 14. With the IC chip 20 connected to the array circuit board 11B via the ACFs 30 through pressure bonding, the conductive particles 30B of the ACFs 30 are between the panel-side input terminals T2 and the input-side bumps B1 or the panel-side output terminals T3 and the output-side bumps B2 and pressed. According to the configuration, the electrical connections are established between the panel-side input terminals T2 and the input-side bumps B1 and between the panel-side output terminals T3 and the output-side bumps B2.

Figure 6:
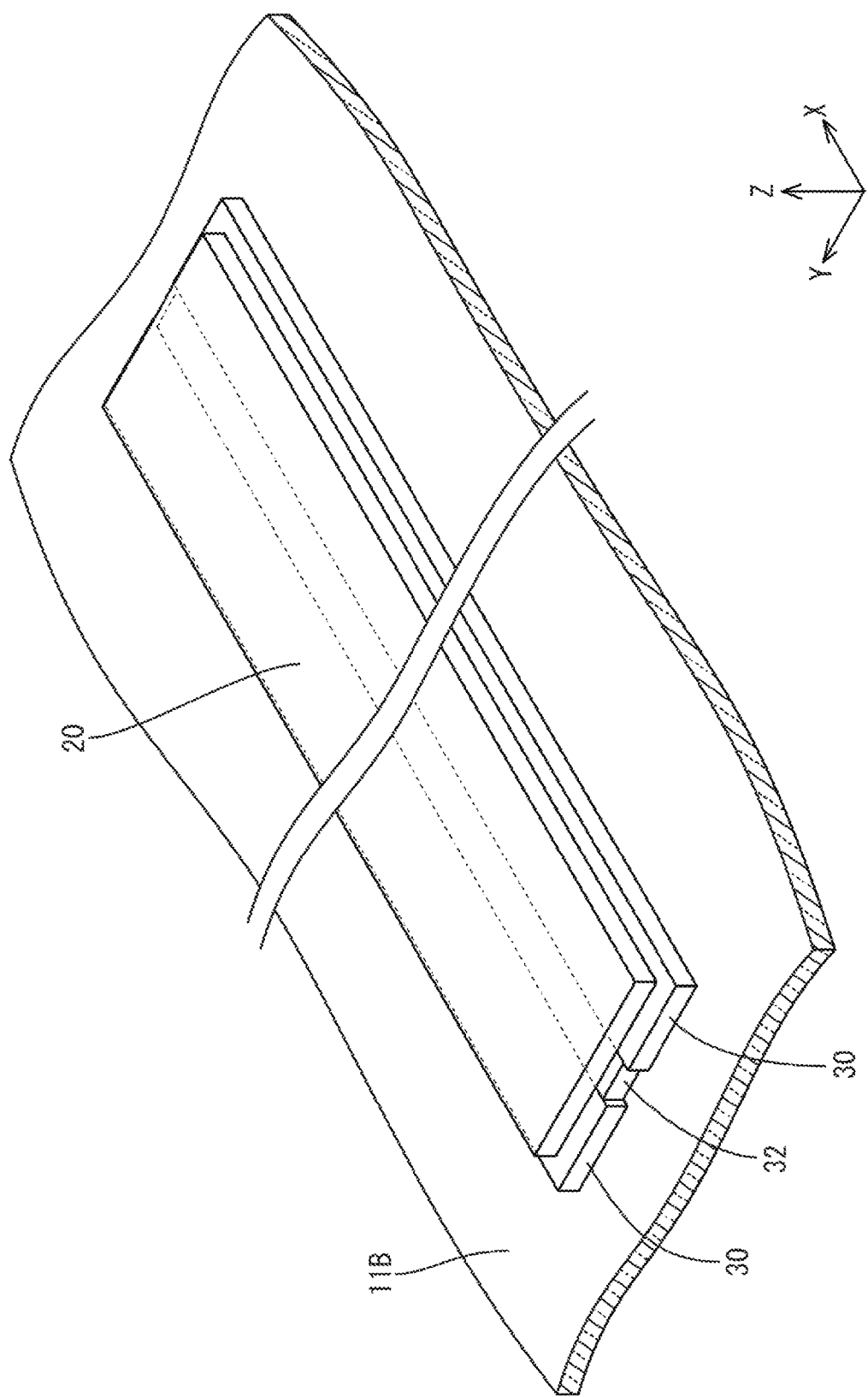
FIG. 6 is a perspective view of an IC chip mounting area and therearound.

As illustrated in FIGS. 4 to 6, a resin film 32 is formed between the array circuit board 11B and the IC chip 20 to fill a gap between the ACFs 30. Portions of the gap between the ACFs 30 on outer sides are filled with the resin film 32. The resin film 32 does not include the conductive particles 30B, which are included in the ACFs 30. The resin film 32 only includes a thermoset resin with a rate of cure shrinkage smaller than that of the ACFs 30. The smaller rate of cure shrinkage is achieved by adjusting kinds and amounts of thermoset resin and setting agent added to the thermoset resin. In the production process of the liquid crystal panel 11, the IC chip 20 is connected to the array circuit board 11B via the ACFs 30 through pressure bonding and the gap between the ACFs 30 is filled with the resin film 32.

The resin film 32 formed to fill the gap between the ACFs 30 is located between the center of the IC chip 20 in the plan view and the array circuit board 11B. As illustrated in FIG. 4, small portions of the ACFs 30 and the resin film 32 between the array circuit board 11B and the IC chip 20 are located outside outer edges of the IC chip 20 in the plan view. According to the configuration, even if the IC chip 20 is slightly off a defined mounting position during mounting of the IC chip 20 to the array circuit board 11B, the electrical connection between the array circuit board 11B and the IC chip 20 is properly established.

In general, when an IC chip is mounted on an array circuit board through the COG technology in a production process of a liquid crystal panel, a single ACF is provided between the array circuit board and the IC chip and the IC chip is connected to the array circuit board via the ACF through pressure bonding. When an ACF shrinks during curing in a known production process of a liquid crystal panel, an entire mounting area of a mounting surface of an IC chip in which the ACF is disposed is pulled toward an array board by the ACF resulting in a large warp of the IC chip. When the IC chip is significantly warped, proper electrical connection cannot be maintained between the array circuit board and the IC chip.

Figure 7:
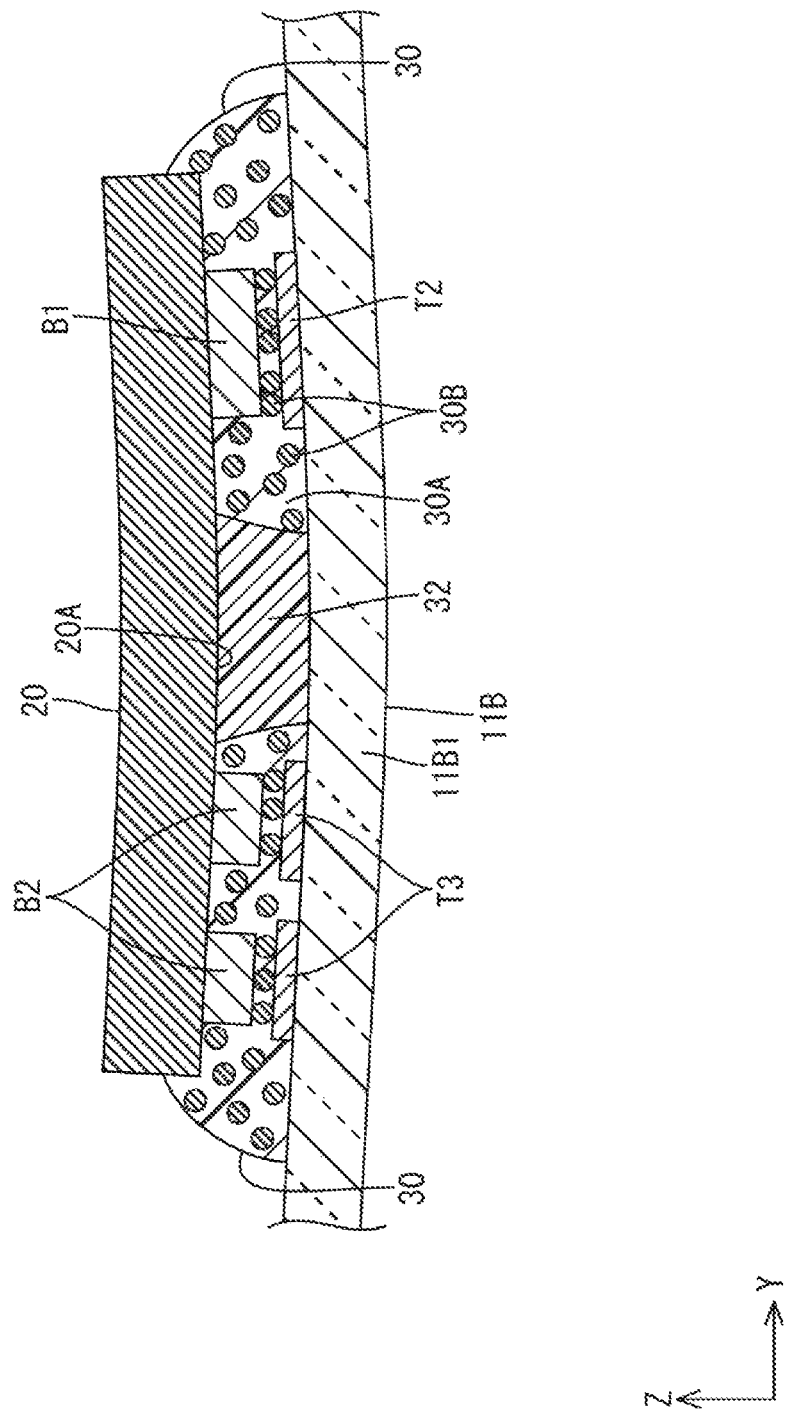
FIG. 7 is a cross-sectional view of an IC chip along a short-side direction illustrating how ACFs shrink during curing.

In this embodiment, the IC chip 20 is connected to the array circuit board 11B via two ACFs 30 that are separated from each other. The gap between the ACFs 30 created by separating the ACFs 30 from each other is filled with the resin film 32. According to the configuration, forces of the ACFs 30 pulling the IC chip 20 toward the array circuit board 11B produced when the ACFs 30 between the array circuit board 11B and the IC chip 20 shrink during curing in the production process of the liquid crystal panel 11 can be reduced in the area in which the resin film 32 is disposed. In comparison to the known configuration in which the IC chip is electrically connected to the array circuit board via the single ACF in the area in which the ACF 30 is disposed between the array circuit board 11B and the IC chip 20, the warp of the IC chip 20 is smaller when the ACFs 30 shrinks during curing, as illustrated in FIG. 7. Namely, the warp of the IC chip 20 can be reduced in comparison to the known configuration.

Furthermore, in this embodiment, as described earlier, between the array circuit board 11B and the IC chip 20, the portions of the gap between the ACFs 30 facing the outside are filled with the resin film 32. Namely, between the array circuit board 11B and the IC chip 20, the ACFs 30 or the resin film 32 is provided in the portions facing the outside. Therefore, water or dust entering between the mounting area of the array circuit board 11B in which the IC chip 20 is mounted and the mounting surface 20A of the IC chip 20 is restricted or reduced. Namely, water or dust entering the connecting portions between the array circuit board 11B and the IC chip 20 is restricted or reduced. In the liquid crystal panel 11 according to this embodiment, the connecting portions between the array circuit board 11B and the IC chip 20 are protected from dust, moisture, and water while the warp of the IC chip 20 electrically connected to the array circuit board 11B via the ACFs 30 is reduced.

Because the IC chip 20 in this embodiment has the rectangular shape in the plan view, the IC chip 20 tends to warp in a direction along an edge thereof when the ACFs 30 between the array circuit board 11B and the IC chip 20 shrink during curing. Therefore, the ACFs 30 are separated from each other in the direction along the short edge of the IC chip 20 having the rectangular shape in the plan view. According to the configuration, the forces of the ACFs 30 pulling the IC chip 20 toward the array circuit board 11B produced when the ACFs 30 shrink during curing in the direction along the edge in which the IC chip 20 tends to warp is reduced in the area in which the resin film 32 is disposed. As a result, the warp of the IC chip 20 is effectively reduced.

Because the IC chip 20 in this embodiment has the rectangular shape in the plan view, the center of the IC chip 20 is located the farthest from corners of the IC chip 20. If the center of the IC chip 20 is connected to the array circuit board 11B via the ACF 30, the IC chip 20 tends to significantly warp when the ACF 30 shrinks during curing. In this embodiment, the resin film 32 is disposed between the center of the IC chip 20 in the plan view and the array circuit board 11B. In comparison to the configuration in which the center is connected to the array circuit board 11B via the ACF 30, the warp of the IC chip 20 can be effectively reduced.

A protrusion that protrudes toward the array circuit board may be provided at the center of the mounting surface of the IC chip. With a distal end of the protrusion in contact with the array circuit board, a variation in distance between the array circuit board and the IC chip at the center may be restricted or reduced. According to the configuration, the warp of the IC chip may be reduced. However, the protrusion on the mounting surface of the IC chip may affect circuit design in the mounting area of the array circuit board in which the IC chip is mounted and the mounting surface of the IC chip. Namely, flexibility in circuit design may decrease. Furthermore, a production cost of the IC chip may increase when the protrusion is included. In this embodiment, the warp of the IC chip is reduced without such a protrusion. Therefore, problems described above are less likely to occur.

Figure 8:
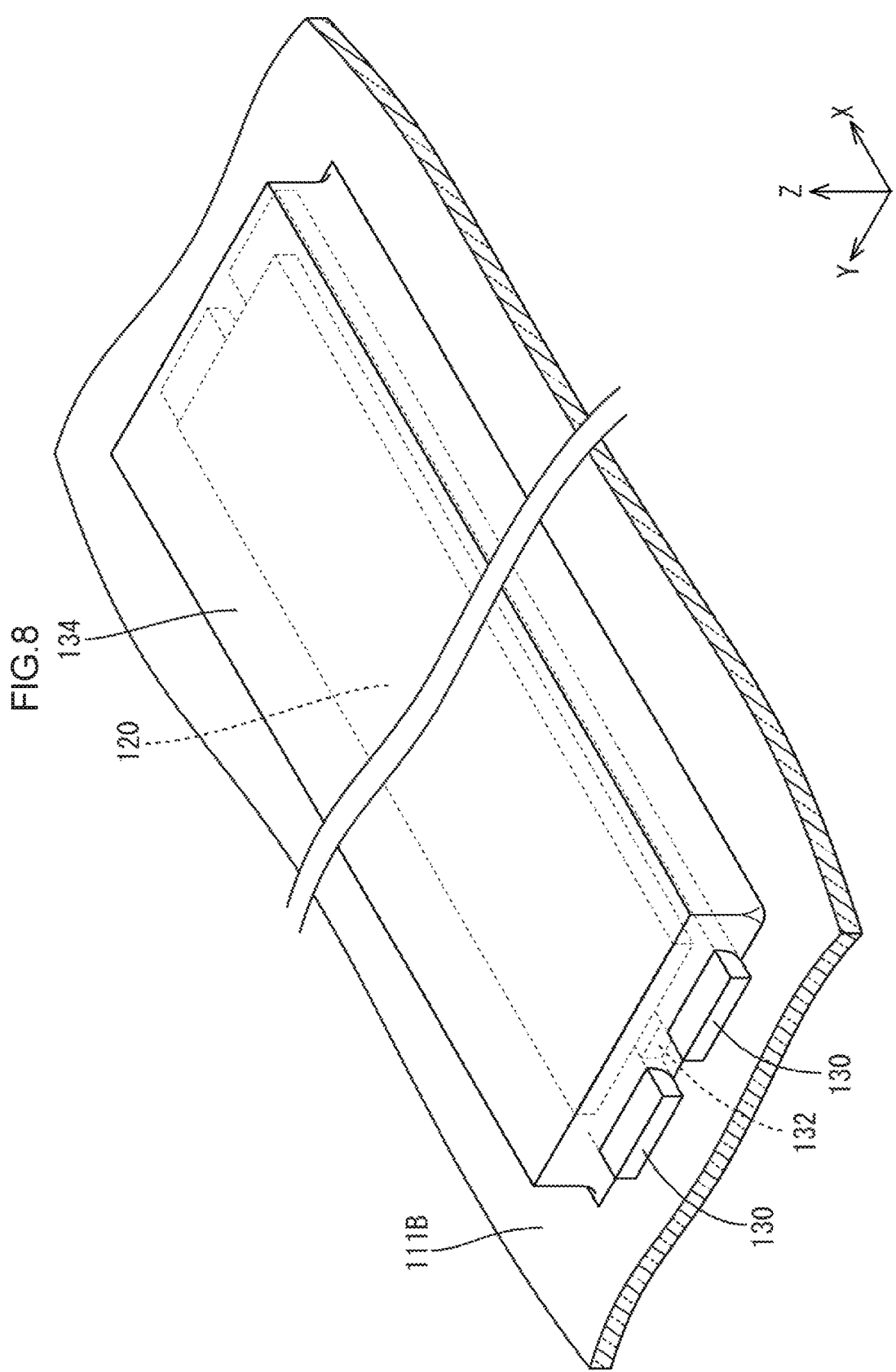
FIG. 8 is a perspective view of an IC chip mounting area and therearound in a modification.

A modification of the first embodiment will be described with reference to FIG. 8. As illustrated in FIG. 8, this modification includes an IC chip 120 that is entirely covered with a transparent sealing member 134. The IC chip 120 is entirely sealed with the sealing member 134. Other configurations are similar to those of the first embodiment. Therefore, the configurations, functions, and effects will not be described. In FIG. 8, portions indicated by numerals with 100 added to the numerals in FIG. 6 correspond with the portions of the first embodiment indicated by the numerals. In the production process of the liquid crystal panel, the IC chip 120 is sealed with the sealing member 134 after the IC chip 120 is mounted on an array circuit board 111B, that is, after two ACFs 130 and a resin film 132 are hardened. In this modification, the IC chip 120 is further protected from dust, moisture, and water with the IC chip 120 entirely sealed.

Figure 9:
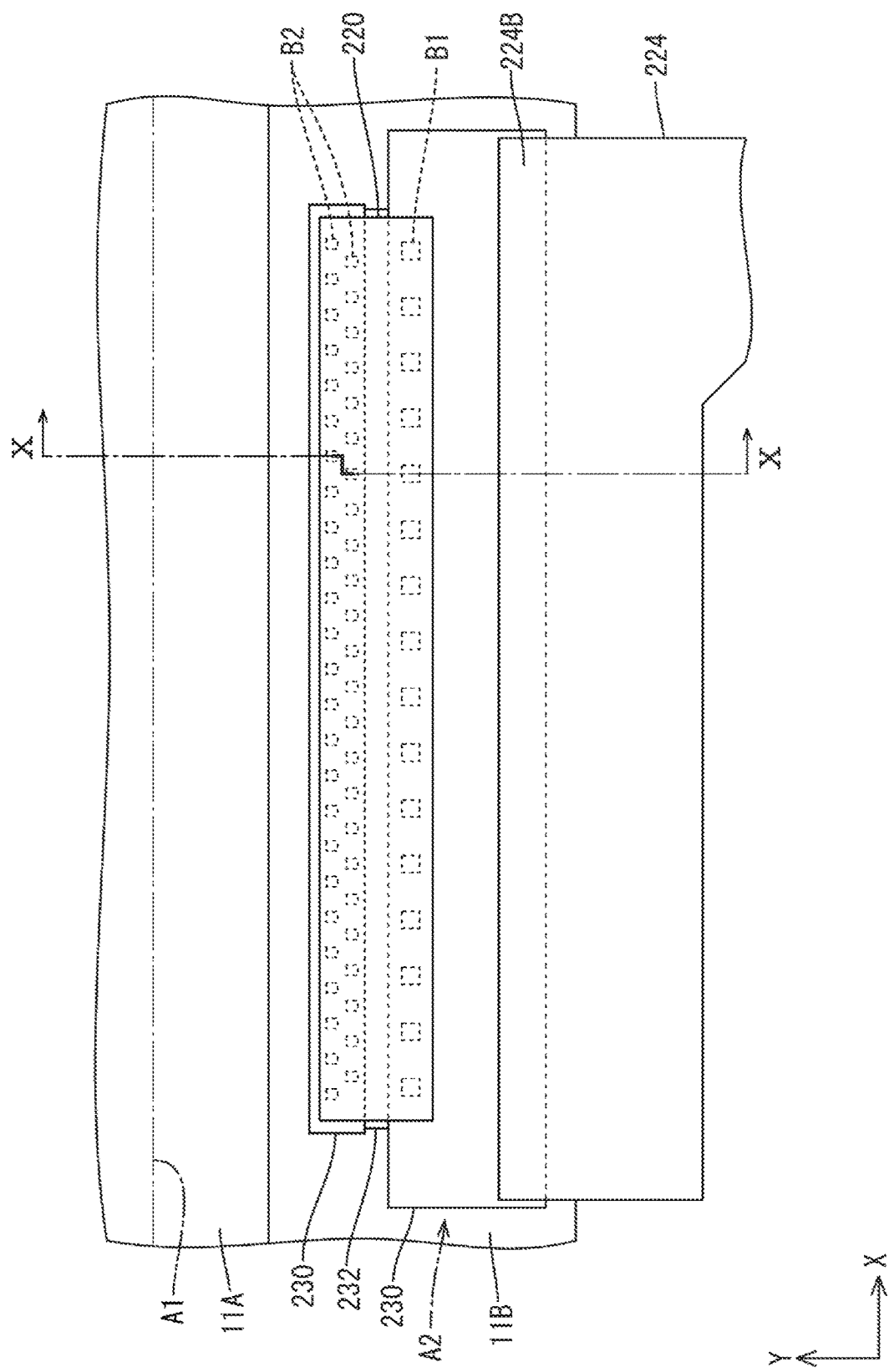
FIG. 9 is a magnified plan view of a non-display area of a liquid crystal panel according to a second embodiment.
Figure 10:
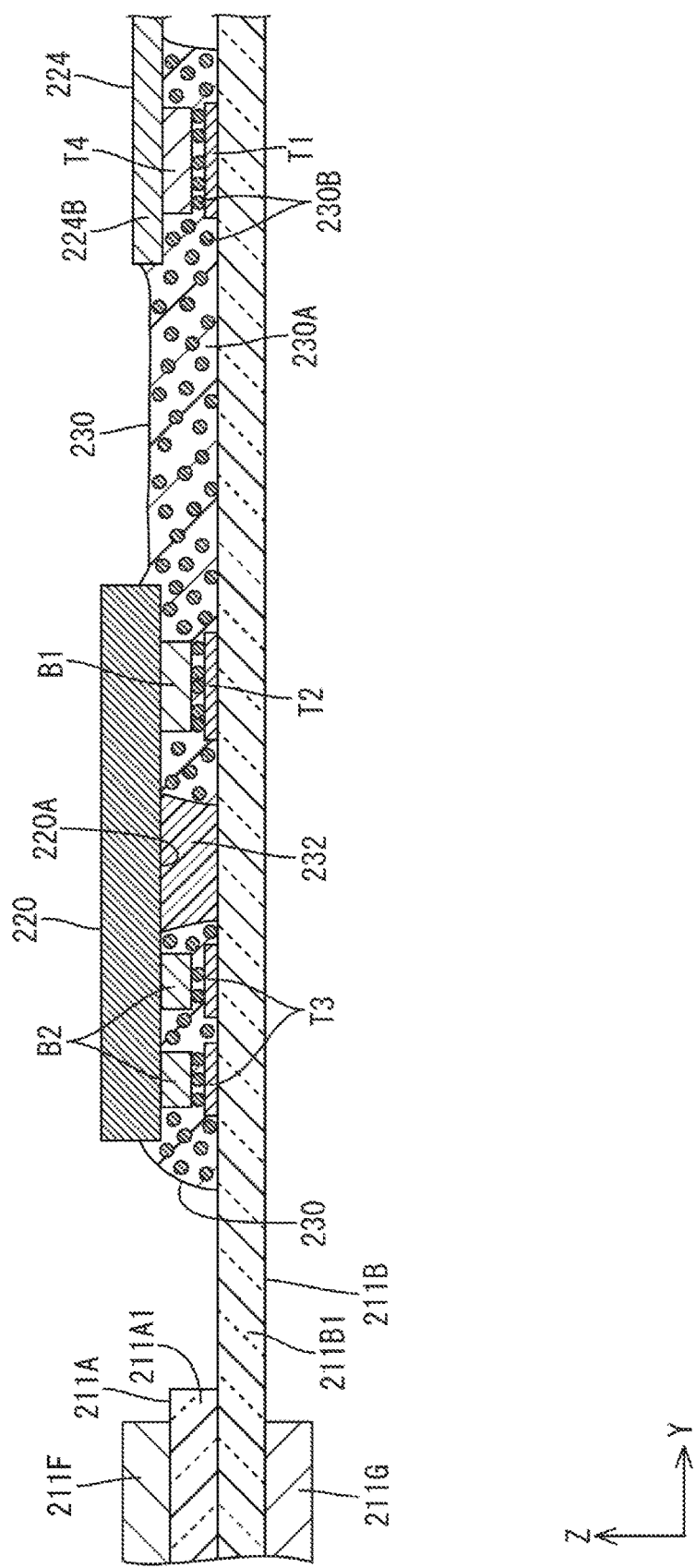
FIG. 10 is a magnified cross-sectional view of the non-display area of the liquid crystal panel illustrating a cross-sectional configuration along line X-X in FIG. 9.

A second embodiment will be described with reference to FIGS. 9 and 10. The second embodiment includes an ACF 230 that is arranged differently from the first embodiment. The ACF 230 is for electrically connecting a flexible circuit board 224 to an array circuit board 211B. Other configurations, functions, and effects are similar to those of the first embodiment and thus will not be described. In FIGS. 9 and 10, portions indicated by numerals with 200 added to the numerals in FIGS. 4 and 5 correspond with the portions of the first embodiment indicated by the numerals.

As illustrated in FIGS. 9 and 10, the ACF 230 for electrically connecting the flexible circuit board 224 to an array circuit board 221B is used for electrically connecting input-side bumps B1 on an IC chip 220 to panel-side input terminals T2 on the array circuit board 211B. Namely, a portion of the ACF 230 for connecting the IC chip 220 to the array circuit board 211B on the flexible circuit board 224 side is arranged in an area between external connection terminals T1 on the array circuit board 211B and board-side terminals T4 and used for electrically connecting the flexible circuit board 224 to the array circuit board 211B. A thermoset resin in the ACF 230 has an insulating property. Therefore, a current does not flow directly from the board-side terminals T4 on the flexible circuit board 224 to the panel-side input terminals T2 on the array circuit board 211B via the ACF 230. The current flows from the board-side terminals T4 on the flexible circuit board 224 to the panel-side input terminals T2 on the array circuit board 211B via relay lines routed between the external connection terminals T1 and the panel-side input terminals T2, similar to the first embodiment.

This embodiment has the configuration described above. According to the configuration, it is not necessary to form an ACF for electrically connecting the flexible circuit board 224 to the array circuit board 211B in addition to the ACF 230 for electrically connecting the input-side bumps B1 on the IC chip 220 to the panel-side input terminals T2 on the array circuit board 211B in a production process of the liquid crystal panel. This simplifies production steps.

Figure 11:
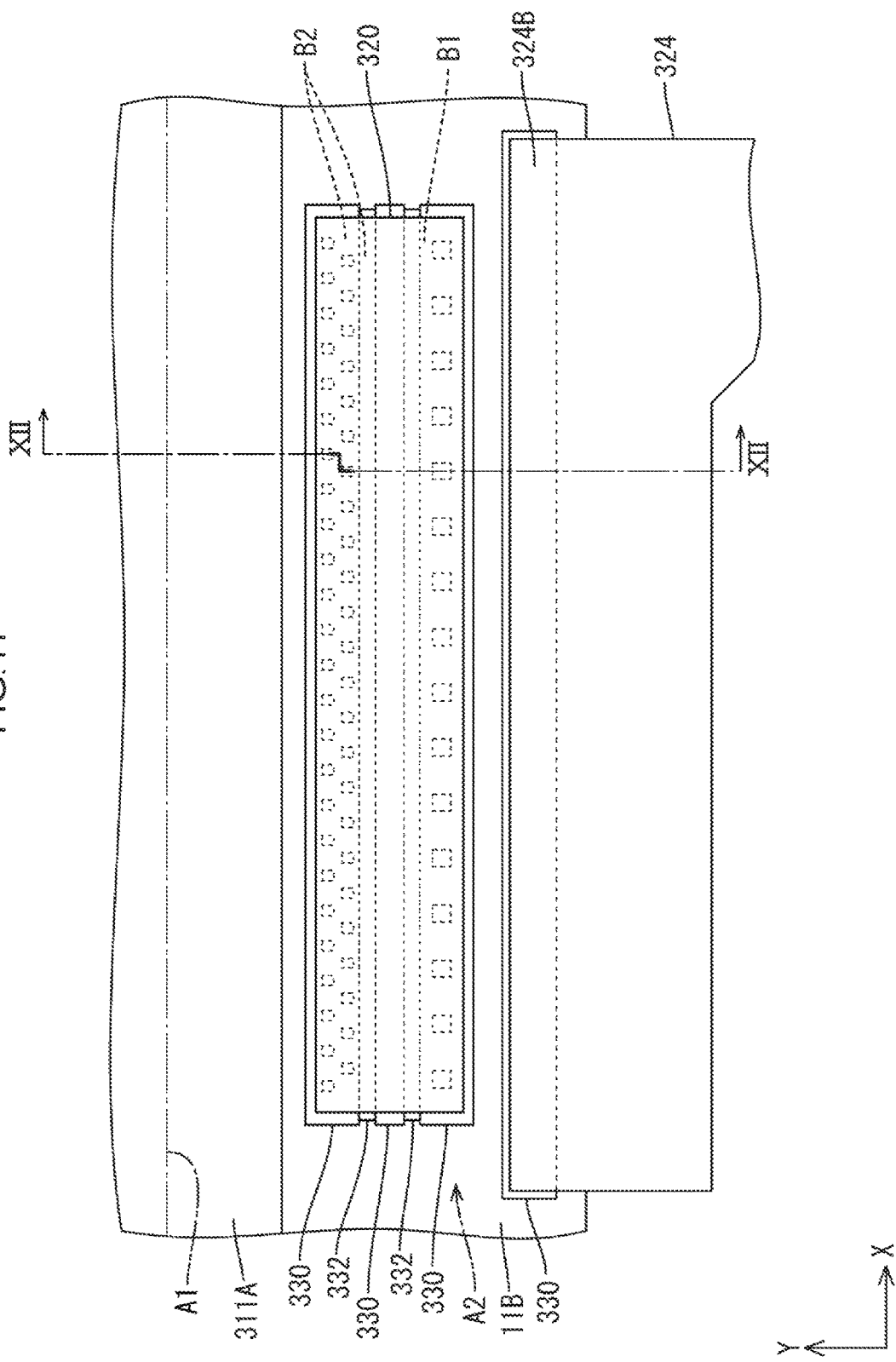
FIG. 11 is a magnified plan view of a non-display area of a liquid crystal panel according to a third embodiment.
Figure 12:
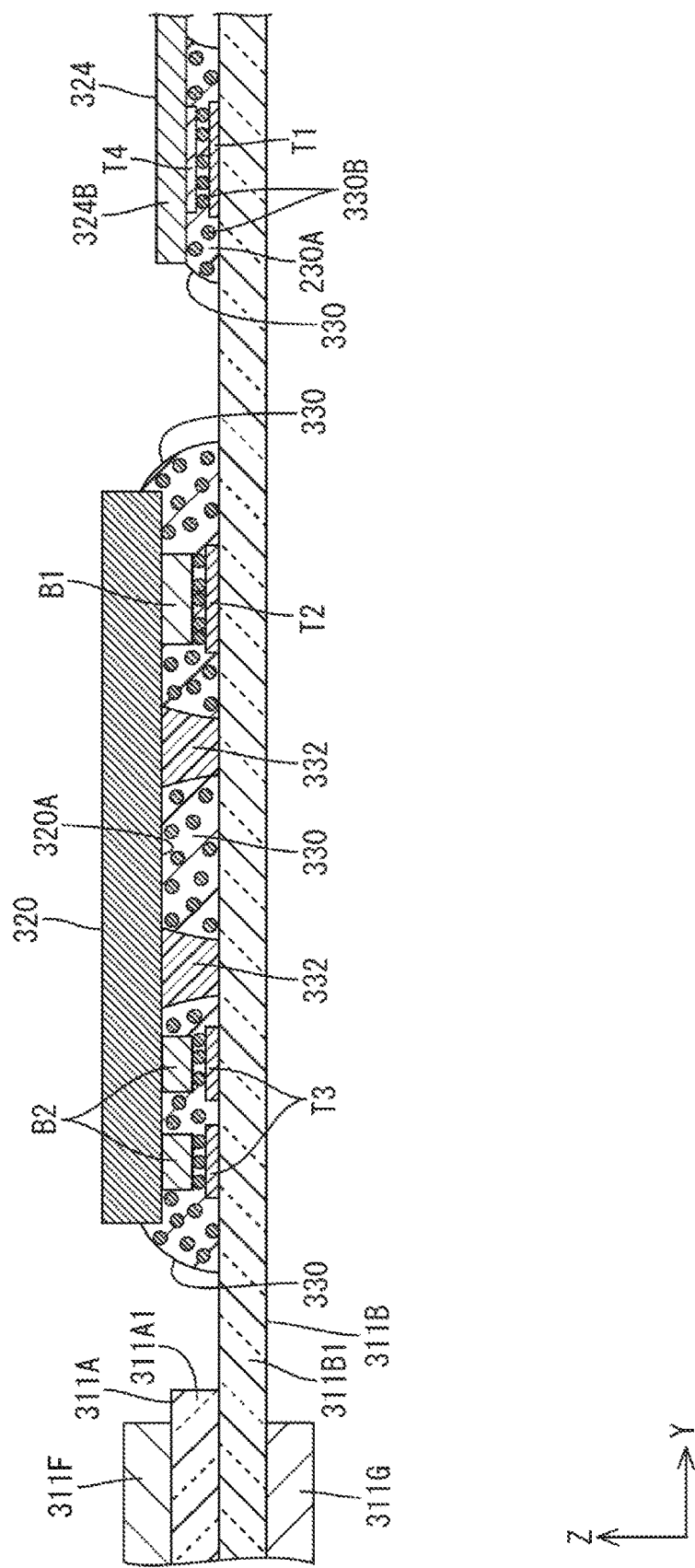
FIG. 12 is a magnified cross-sectional view of the non-display area of the liquid crystal panel illustrating a cross-sectional configuration on a XII-XII plane in FIG. 11.

A third embodiment will be described with reference to FIGS. 11 and 12. The third embodiment includes the number of ACFs 330 different from the first embodiment arranged between an array circuit board 311 and an IC chip 320. Other configurations, functions, and effects are similar to those of the first embodiment and thus will not be described. In FIGS. 11 and 12, portions indicated by numerals with 300 added to the numerals in FIGS. 4 and 5 correspond with the portions of the first embodiment indicated by the numerals.

As illustrated in FIGS. 11 and 12, this embodiment includes three ACFs 330 arranged between an array circuit board 311B and the IC chip 320. The ACF 330 for electrically connecting the input-side bumps B1 on the IC chip 320 to the panel-side input terminals T2 on the array circuit board 311B and the ACF 330 for electrically connecting the input-side bumps B1 on the IC chip 320 to the panel-side input terminals T2 on the array circuit board 311B are formed in shapes and arrangement similar to those of the first embodiment. Another ACF 330 is arranged between the ACF 330 such that the ACF 330 is separated from other ACFs 330. The ACF 330 between an array circuit board 331B and the IC chip 320 are the same kind.

According to the configuration, forces of the ACFs 330 pulling the IC chip 320 toward the array circuit board 311B produced when the ACFs 330 shrink during curing are reduced in areas in which resin films are formed. In comparison to the known configuration in which the IC chip is electrically connected to the array circuit board via a single ACF in the area in which the ACF needs to be formed between the array circuit board and the IC chip, a warp of the IC chip 320 due to the cure shrinkage of the ACFs 330 is smaller. In comparison to the known configuration, the warp of the IC chip 320 can be reduced.

A fourth embodiment will be described with reference to FIG. 13. The fourth embodiment includes the number of ACFs 430 different from the first embodiment arranged between an array circuit board 411B and an IC chip 420. Other configurations, functions, and effects are similar to those of the first embodiment and thus will not be described. In FIG. 13, portions indicated by numerals with 400 added to the numerals in FIG. 4 correspond with the portions of the first embodiment indicated by the numerals.

As illustrated in FIG. 13, this embodiment includes four ACF 430 between the array circuit board 411B and the IC chip 420. The input-side bumps B1 are disposed on a mounting surface 420A of the IC chip 420 along a long-side direction of the IC chip 420 with a large gap at the middle of a long dimension of the IC chip 420. Namely, the input-side bumps B1 are disposed in two areas that are divided by the gap. A resin film 432 is formed in the gap in which the input-side bumps B1 are not disposed. Two ACFs 430 are formed in the areas in which the input-side bumps B1 are disposed, respectively. The output-side bumps B2 are disposed on the mounting surface 420A of the IC chip 420 along the long-side direction of the IC chip 420. The output-side bumps B2 arranged at the middle of the long dimension of the IC chip 420 are dummy bumps that are not electrically connected to the IC chip 420. Namely, the output-side bumps B2 are disposed in two areas divided by dummy bumps B3. The resin film 432 is formed in an area in which the dummy bumps B3 are disposed. Two ACFs 430 are formed in the areas in which the output-side bumps B2 are disposed, respectively.

With four ACFs 430 arranged as described above between the array circuit board 411B and the IC chip 420, the ACFs 430 overlap four corners of the mounting surface 420A of the IC chip 420 in a plan view. Therefore, a gap in a cross-like shape in the plan view is formed among the ACFs 430. Namely, the ACFs 430 are arranged on the mounting surface 420A of the IC chip 420 are separated from each other in a direction along the short edge (the Y-axis direction) and a direction along the long edge (the X-axis direction). The resin film 432 is formed to fill the gap in the cross-like shape. According to the configuration, forces of the ACFs 430 pulling the IC chip 420 toward the array circuit board 411B produced when the ACFs 430 shrink during curing in not only the direction along the short edge (the Y-axis direction) but also the direction along the long edge (the X-axis direction) are reduced in an area in which the resin film 432 is formed. A warp of the IC chip 420 in the curing can be farther effectively reduced.

The dummy bumps B3 between the output-side bumps B2 may be made of metal to perform a function to improve heat dissipating performance of the IC chip. Furthermore, the dummy bumps B3 may include ends that are in contact with the array circuit board 411B to perform a function to adjust a position of the IC chip 420 relative to the array circuit board 411B (a distance between the array circuit board 411B and the IC chip 420). In this embodiment, the warp of the IC chip 420 can be reduced while the array circuit board 411B and the IC chip 420 are electrically connected to each other in the area in which the input-side bumps B1 and the output-side bumps B2 are disposed and the dummy bumps B3 perform the functions in the area in which the dummy bumps B3 are disposed.

A fifth embodiment will be described with reference to FIGS. 14 and 15. The fifth embodiment includes a resin film, a kind of which is different from the first embodiment. The resin film is formed in a gap between two ACFs 530 that are arranged between an array circuit board 511B and an IC chip 520. Other configurations, functions, and effects are similar to those of the second embodiment and thus will not be described. In FIGS. 14 and 15, portions indicated by numerals with 500 added to the numerals in FIGS. 4 and 5 correspond with the portions of the first embodiment indicated by the numerals.

As illustrated in FIGS. 14 and 15, two ACFs 530 are formed to cover input-side bumps B1 and output-side bumps B2 on the IC chip 520. An ACF (an example of a resin film) 531, a kind of which is different from other ACFs 530, is formed to fill the gap between the ACFs 530. The ACF 531 has cure shrinkage smaller than that of other ACFs 530. Arrangements of the input-side bumps B1, the output-side bumps B2, and the ACFs 530 are similar to those of the first embodiment. The ACF 531 in the different kind includes a thermoset resin 531A and a large number of conductive particles 531B dispersed in the thermoset resin 531A similar to the ACFs 530. The kind of the thermoset resin 531A and the kind and the amount of the curing agent added to the thermoset resin 531A are different from those of the ACFs 530.

According to the configuration, the ACFs 530 and the ACF 531 in the different kind in this embodiment can be arranged on the array circuit board 511B in the same step. In comparison to a configuration in which a resin film is formed by filling a gap between the ACFs 530 after the IC chip 520 is connected to the array circuit board 511B, steps of the production process can be reduced.

The resin film arranged between the adjacent ACFs in each of the first to the fifth embodiments is an example of inter-film members. The resin film arranged in a portion other than portions facing the outside is an example of a low shrinkage portion.

A sixth embodiment will be described with reference to FIG. 16. The sixth embodiment includes an internal space D1 between a part of an array circuit board 611B and a part of an IC chip 620. Other configurations, functions, and effects are similar to those of the first embodiment and thus will not be described. In FIG. 16, portions indicated by numerals with 600 added to the numerals in FIG. 6 correspond with the portions of the first embodiment indicated by the numerals.

As described in FIG. 16, resin films 632 are formed in portions of a gap between two ACFs 630 formed between an array circuit board 611 and the IC chip 620 facing the outside to fill the portions of the gap. Namely, the internal space (an example of the low shrinkage portion) S1 is provided between the array circuit board 611B and the IC chip 620. Material of the ACFs 630 and the resin films 632 are similar to those of the first embodiment. The resin films 632 have cure shrinkage smaller than cure shrinkage of the ACFs 630. Because the internal space S1 is filled with the air, it is obvious that the cure shrinkage in the internal space S1 is smaller than the cure shrinkage of the ACFs 630. A combination of the resin films 632 and the internal space S1 is an example of the inter-film member.

Regarding the array circuit board 611B in this embodiment having the above-described configuration, forces of the ACFs 630 pulling the IC chip 620 toward the array circuit board 611B when the ACFs 630 between the array circuit board 611B and the IC chip 620 shrink during curing are reduced in the internal space S1 and areas in which the resin films 632 are arranged. In comparison to the known configuration in which the IC chip is electrically connected to the array circuit board via a single ACF in the area in which the ACF needs to be arranged between the array circuit board and the IC chip, a warp of the IC chip 620 when the ACFs 630 shrink during curing is smaller. In comparison to the known configuration, the warp of the IC chip 620 can be reduced.

In this embodiment, as described above, the portions of the gap between the ACFs 630 arranged between the array circuit board 611B and the IC chip 620 facing the outside are filled with the resin films 632. Namely, either the ACFs 630 or the resin films 632 are provided in the portions between the array circuit board 611B and the IC chip 620 facing the outside. Therefore, water or dust is blocked or less likely to enter between a mounting area of the array circuit board 611B in which the IC chip 620 is mounted and a mounting surface 620A of the IC chip 620, namely, connecting portions between the array circuit board 611B and the IC chip 620. According to such a configuration, dust, moisture, and water are restricted from entering the connecting portions between the array circuit board 611B and the IC chip 620 while the warp of the IC chip 620 electrically connected to the array circuit board 611B via the ACFs 630 is reduced.

Modifications of the above embodiments will be listed below.

(1) In each of the above embodiments, multiple ACFs between the array circuit board and the IC chip are separated from each other in the direction along one of the edges of the mounting surface of the IC chip. However, the configuration is not limited to such a configuration. As long as the array circuit board and the IC chip are electrically connected to each other, the ACFs between the array circuit board and the IC chip can be separated from each other in the direction that is not along any one of the edges of the mounting surface of the IC chip.

(2) In each of the above embodiments, multiple ACFs between the array circuit board and the IC chip are the same kind. However, the ACFs between the array circuit board and the IC chip may be different kinds. Namely, the kinds of the thermoset resins and the kinds of the contents of the conductive particles may be different from ACF to ACF.

(3) The arrangement of the ACFs between the array circuit board and the IC chip may be altered as appropriate from that of the above embodiments.

(4) In each of the above embodiments, the array circuit board included in the liquid crystal panel is described as an example of a circuit board. However, the circuit board is not limited to the array circuit board. The present invention can be applied to various circuit board including electronic components mounted on circuit boards via ACFs.

(5) In the sixth embodiment, the resin films having the cure shrinkage smaller than the ACFs. However, if a percentage of the internal space between the ACFs relative to the resin films is significantly high, the cure shrinkage of the resin films may be larger than the ACFs. In such a case, the forces of the ACFs pulling the IC chip toward the array circuit board can be reduced in the internal space when the ACF shrink. Therefore, the warp of the IC chip can be reduced in comparison to the known configuration.

The embodiments of the present invention described in detail are merely examples and do not limit the scope of claims. The scope of claims includes various modifications and alterations of the above embodiments.

EXPLANATION OF SYMBOLS

10: liquid crystal display device, 11: liquid crystal panel, 11A: color filter circuit board, 11A1, 11B1: glass substrate, 11B, 111B, 211B, 311B, 411B, 511B, 611B: array circuit board, 14: backlight unit, 20, 120, 220, 320, 420, 520, 620: IC chip, 22: control circuit board, 24, 224, 324, 424, 524: flexible circuit board, 30, 130, 230, 330, 430, 530, 531, 631: ACF, 32, 132, 232, 332, 432, 632: resin film (inter-film member), 134: sealing member, B1: input-side bump, B2: output-side bump, B3: dummy bump, S1: internal space (inter-film member), T1: external connection terminal, T2: panel-side input terminal, T3: panel-side output terminal, T4: board-side terminal

The invention claimed is:

1. A circuit board comprising:
    a substrate;
    an electronic component disposed on the substrate;
    a plurality of anisotropic conductive films disposed between the substrate and the electronic component for electrically connecting the electronic component to the substrate, the anisotropic conductive films being separated from each other; and
    an inter-film member comprising:
    at least one resin film disposed in at least a portion of a gap between the anisotropic conductive films adjacent to each other between the substrate and the electronic component to fill the portion of the gap facing an outside; and
    a low shrinkage portion having cure shrinkage smaller than cure shrinkage of the anisotropic conductive films.

2. The circuit board according to claim 1, wherein the resin film and the low shrinkage portion are made of same material.

3. The circuit board according to claim 1, wherein
    the electronic component has a rectangular shape in a plan view, and
    the plurality of anisotropic conductive films are separated from each other in a direction along one of edges of the electronic component having the rectangular shape in the plan view.

4. The circuit board according to claim 3, wherein the low shrinkage portion is arranged between a center of the electronic device in the plan view and the substrate.

5. The circuit board according to claim 1, wherein
    the electronic component includes a bump protruding toward the substrate and electrically connected to the electronic component and a dummy bump protruding toward the substrate and not electrically connected to the electronic component, and
    the plurality of anisotropic conductive films are disposed at least in an area in which the bumps are disposed.

6. The circuit board according to claim 1, wherein the electronic component is covered with a sealing member.

7. A display panel comprising the circuit board according to claim 1, wherein
    the substrate includes a display area in which an image is displayed and a non-display area in which an image is not displayed, and
    the electronic component is disposed in the non-display area of the substrate.

8. The display panel according to claim 7, further comprising a flexible circuit board connected to the non-display area of the substrate, wherein one of the plurality of anisotropic conductive films extends from the substrate and the flexible circuit board to electrically connect the flexible circuit board to the substrate.

9. A display device comprising:
    a light source; and
    the display panel according to claim 7 for displaying an image using light from the light source, wherein
    the electronic component is an IC chip for driving the display panel.

* * * * *